United States Patent
Chung et al.

(10) Patent No.: US 11,038,112 B2
(45) Date of Patent: Jun. 15, 2021

(54) ELECTROLUMINESCENT DEVICE, AND DISPLAY DEVICE COMPRISING THE SAME

(71) Applicant: SAMSUNG ELECTRONICS CO., LTD., Suwon-si (KR)

(72) Inventors: Dae Young Chung, Suwon-si (KR); Moon Gyu Han, Suwon-si (KR); Tae Hyung Kim, Seoul (KR); Sang Jin Lee, Seoul (KR); Eun Joo Jang, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 368 days.

(21) Appl. No.: 16/203,988

(22) Filed: Nov. 29, 2018

(65) Prior Publication Data

US 2019/0189928 A1    Jun. 20, 2019

(30) Foreign Application Priority Data

Dec. 19, 2017 (KR) .................. 10-2017-0175348
Nov. 22, 2018 (KR) .................. 10-2018-0145252

(51) Int. Cl.
| | | |
|---|---|---|
| H01L 51/50 | (2006.01) | |
| H01L 51/00 | (2006.01) | |
| H01L 51/52 | (2006.01) | |

(52) U.S. Cl.
CPC ...... *H01L 51/0067* (2013.01); *H01L 51/0007* (2013.01); *H01L 51/0059* (2013.01);
(Continued)

(58) Field of Classification Search
None
See application file for complete search history.

(56) References Cited

U.S. PATENT DOCUMENTS

| | | | |
|---|---|---|---|
| 7,910,400 B2 | 3/2011 | Kwon et al. | |
| 2013/0069036 A1* | 3/2013 | Miyata | C09K 11/025 |
| | | | 257/13 |
| 2018/0019427 A1 | 1/2018 | Kazlas et al. | |

FOREIGN PATENT DOCUMENTS

| | | |
|---|---|---|
| CN | 105720204 B | 3/2018 |
| KR | 100754396 B1 | 8/2007 |
| KR | 20080074548 A | 8/2008 |
| KR | 101550830 B1 | 9/2015 |

(Continued)

OTHER PUBLICATIONS

Hyo-Min Kim et al. "Metal-Oxide Stacked Electron Transport Layer for Highly Efficient Inverted Quantum-Dot Light Emitting Diodes", ACS Applied Materials & Interfaces, Oct. 3, 2016, pp. 28727-28736, ACS Publication, 2016 American Chmical Society, vol. 8.

(Continued)

*Primary Examiner* — Gregory D Clark
(74) *Attorney, Agent, or Firm* — Cantor Colburn LLP

(57) ABSTRACT

An electroluminescent device and a display device includes the same are disclosed. The electroluminescent device includes a first electrode; a hole transport layer disposed on the first electrode and including a first organic material having a conjugated structure; an emission layer disposed directly on the hole transport layer and including a plurality of light emitting particles; an electron transport layer disposed on the emission layer; and a second electrode disposed on the electron transport layer, wherein at least one of the light emitting particles includes a core and a hydrophilic ligand attached to a surface of the core, wherein the hole transport layer has a first thickness and a second thickness at any two point locations, and the first thickness and the second thickness satisfy Equation 1.
Equation 1 is described in the detailed description.

19 Claims, 7 Drawing Sheets

(52) U.S. Cl.
CPC ........ *H01L 51/0072* (2013.01); *H01L 51/502* (2013.01); *H01L 51/5016* (2013.01); *H01L 51/5092* (2013.01); *H01L 51/5096* (2013.01); *H01L 51/5206* (2013.01); *H01L 51/5221* (2013.01); *H01L 51/5056* (2013.01); *H01L 51/5072* (2013.01); *H01L 2251/558* (2013.01)

(56) References Cited

FOREIGN PATENT DOCUMENTS

| | | |
|---|---|---|
| KR | 101695442 B1 | 1/2017 |
| KR | 101725486 B1 | 4/2017 |
| KR | 101728575 B1 | 4/2017 |
| WO | 2014209154 A1 | 12/2014 |

OTHER PUBLICATIONS

Mariano D. Susman et al., "Refractive Index Sensing Using Visible Electromagnetic Resonances of Supported Cu2O Particles", ACS, Applied Materials & Interfaces, Jan. 30, 2017, pp. 8177-8186, vol. 9, ACS Publications, 2017 American Chemical Society.

Qianqian Huang et al., "High-performance quantum dot light-emitting diodes with hybrid hole transport layer via doping engineering", Optics Express, Oct. 31, 2016, pp. 25955-25963, vol. 24, No. 23.

Extended European Search Report dated May 20, 2019, of the corresponding European Patent Application No. 18208266.9.

Xiaolong He et al., "6-4: Influence of Hole Transporting Layer Thickness on Quantum Dot Light Emitting Diodes," SID Symposium Digest of Technical Papers, 2017, pp. 61-63, vol. 48, No. 1.

Yanjie Zhang et al., "Overview of Stabilizing Ligands for Biocompatible Quantum Dot Nanocrystals," Sensors, Nov. 28, 2011, pp. 11036-11055, vol. 11, No. 12.

Yatao Zou et al., "Crosslinked conjugated polymers as hole transport layers in high-performance quantum dot light-emitting diodes," Nanoscale Horizons, Mar. 7, 2017, pp. 156-162, vol. 2, No. 3.

EP Office Action dated Mar. 30, 2021, of the corresponding European Patent Application No. 18208266.9.

\* cited by examiner

ELECTROLUMINESCENT DEVICE, AND DISPLAY DEVICE COMPRISING THE SAME

CROSS-REFERENCE TO RELATED APPLICATION

This application claims priority to and the benefit of Korean Patent Application No. 10-2017-0175348 filed in the Korean Intellectual Property Office on Dec. 19, 2017, and Korean Patent Application No. 10-2018-0145252 filed in the Korean Intellectual Property Office on Nov. 22, 2018, and all the benefits accruing therefrom under 35 U.S.C. § 119, the entire content of which is incorporated herein by reference.

BACKGROUND

1. Field

An electroluminescent device and a display device comprising the same are disclosed.

2. Description of the Related Art

Quantum dots are a nanocrystal semiconductor material having a diameter of less than or equal to around 10 nanometers (nm), which show, e.g., exhibit, quantum confinement effects. Quantum dots generate stronger light in a narrow wavelength region than the commonly used phosphor. Quantum dots emit light when the excited electrons are transitioned from a conduction band to a valance band and emitted wavelengths are changed depending upon a particle size, e.g., the wavelength of light emitted by quantum dots varies with particle size of the quantum dots, even in the same material. As quantum dots with a relatively smaller particle size emit light of a relatively shorter wavelength, light in a desirable wavelength may be obtained by adjusting sizes of the quantum dots.

In other words, production costs of electronic devices including an emission layer including quantum dots may be decreased, compared to an organic light emitting diode including an emission layer including phosphorescent and/or phosphor material, and desirable color may be emitted by changing sizes of quantum dots, without the need to include other organic materials in the emission layer for emitting light of other colors.

SUMMARY

An electroluminescent device capable of lowering a driving voltage and a leakage current and confining excitons in an emission layer effectively and a display device including the same are provided.

According to an embodiment, an electroluminescent device includes a first electrode; a hole transport layer disposed on the first electrode and including a first organic material having a conjugated structure; an emission layer disposed directly on the hole transport layer and including a plurality of light emitting particles; an electron transport layer disposed on the emission layer; and a second electrode disposed on the electron transport layer, wherein at least one of the light emitting particles includes a core and a hydrophilic ligand attached to a surface of the core, wherein the hole transport layer has a first thickness and a second thickness at any two point locations, and the first thickness and the second thickness satisfy Equation 1.

$$\frac{t_1 - t_2}{t_1} \times 100 \leq A \qquad \text{Equation 1}$$

In Equation 1, $t_1$ is the first thickness, $t_2$ is the second thickness, $t_1 - t_2 \geq 0$, $t_1 > 0$, $t_2 > 0$, and $0 \leq A \leq 25$.

The first organic material may have a minimum excitation triplet energy level of about 2.6 electronvolts (eV) to about 3.0 eV.

The first organic material may include a conductive monomolecular organic nanomaterial.

The first organic material may include a quinolone compound, a triazine compound, a quinoline compound, a triazole compound, a carbazole compound, an aromatic amine compound, or a combination thereof.

The first organic material may include a compound represented by Chemical Formula 1, Chemical Formula 2, or a bicarbazole compound.

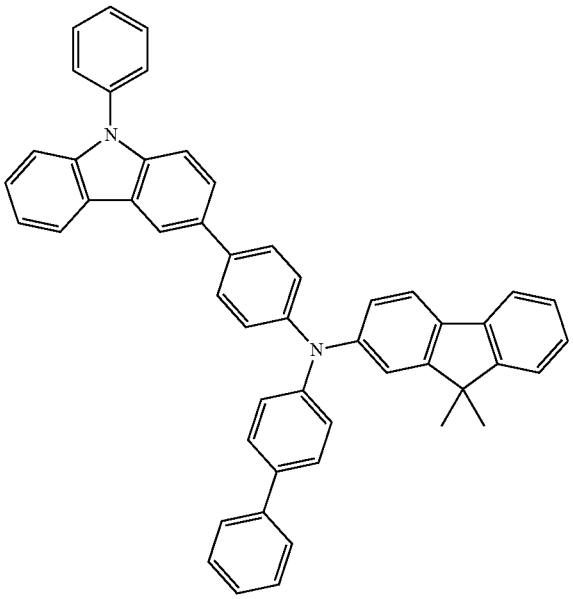

Chemical Formula 1

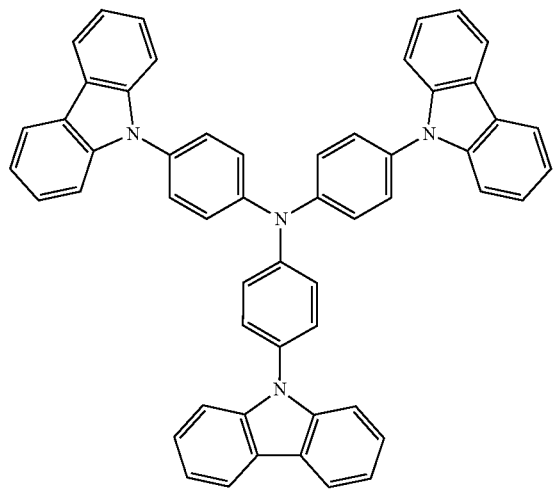

Chemical Formula 2

The hole transport layer may include at least two different first organic materials.

The at least two different first organic materials may be mixed to provide a single layer.

The at least two different first organic materials may include a separate layer.

The hole transport layer may have an average thickness in a range of about 20 nm to about 200 nm.

The hydrophilic ligand may include a C2 to C20 linear or branched alkyl group substituted with a thiol group at a first terminal end of the C2 to C20 linear or branched alkyl group and a hydroxy group at a second terminal end of the C2 to C20 linear or branched alkyl group.

The core may include a quantum dot.

The quantum dot may include a Group II-VI compound that does not include Cd, a Group III-V compound, a Group IV-VI compound, a Group IV element or compound, a Group compound, a Group I-II-IV-VI compound that does not include Cd, or a combination thereof.

The quantum dot may have a core-shell structure and the hydrophilic ligand may be attached to a surface of the shell.

The electroluminescent device may further include hole injection layer between the first electrode and the hole transport layer.

The hole injection layer may include a second organic material having a conjugated structure.

The second organic material may include a conductive monomolecular organic nanomaterial having a conjugation structure, a conductive low molecular organic nanomaterial having a conjugated structure, or a combination thereof.

The second organic material may include a quinolone compound, a triazine compound, a quinoline compound, a triazole compound, a carbazole compound, an aromatic amine compound, or a combination thereof.

The hole injection layer may consist of the second organic material and the second organic material may be doped with a p-type dopant.

According to another embodiment, a display device includes the electroluminescent device.

The electroluminescent device according to an embodiment may reduce a driving voltage and a leakage current and may confine excitons in an emission layer effectively, and thus luminous efficiency may be improved.

In addition, a display device including an electroluminescent device having improved luminous efficiency according to an embodiment may be provided.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
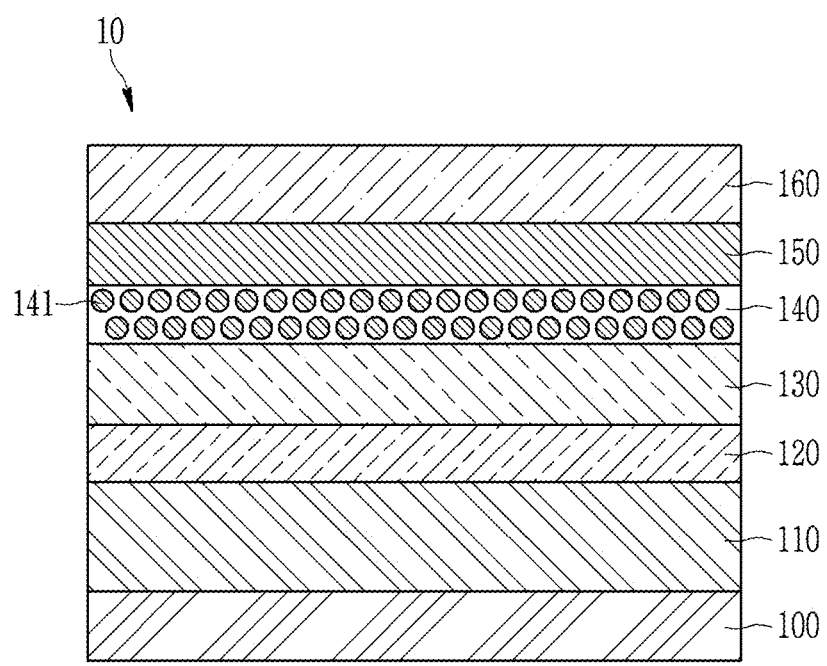
FIG. 1 is a schematic cross-sectional view of an electroluminescent device according to an embodiment.

Example embodiments of the present disclosure will hereinafter be described in detail, and may be easily performed by those who have common knowledge in the related art. However, this disclosure may be embodied in many different forms, and is not to be construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used herein, "group" may refer to a group of Periodic Table.

As used herein, "Group II" may refer to Group IIA and Group IIB, and examples of Group II metal may be Cd, Zn, Hg, and Mg, but are not limited thereto.

As used herein, examples of "Group II metal that does not include Cd" may refer to a Group II metal except Cd, for example Zn, Hg, Mg, etc.

As used herein, "Group III" may refer to Group IIIA and Group IIIB, and examples of Group III metal may be Al, In, Ga, and Tl, but are not limited thereto.

As used herein, "Group IV" may refer to Group IVA and Group IVB, and examples of a Group IV metal may be Si, Ge, and Sn, but are not limited thereto. As used herein, the term "metal" may include a semi-metal such as Si.

As used herein, "Group I" may refer to Group IA and Group IB, and examples may include Li, Na, K, Rb, and Cs, but are not limited thereto.

As used herein, "Group V" may refer to Group VA, and examples may include nitrogen, phosphorus, arsenic, antimony, and bismuth, but are not limited thereto.

As used herein, "Group VI" may refer to Group VIA, and examples may include sulfur, selenium, and tellurium, but are not limited thereto.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise.

"At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, "amine" has the general formula NRR, wherein each R is independently hydrogen, an alkyl group, or an aryl group.

As used herein, "aromatic" means an organic compound or group comprising at least one unsaturated cyclic group having delocalized pi electrons. The term encompasses both hydrocarbon aromatic compounds and heteroaromatic compounds.

As used herein, a "conjugated structure" is a structure comprising a conjugated system as that term is understood in the art, i.e., a system of connected p-orbitals with delocalized electrons. A conjugated system has a region of overlapping p-orbitals, bridging the interjacent single bonds. They allow a delocalization of pi electrons across all the adjacent aligned p-orbitals.

The luminous efficiency of an emission layer including quantum dots is determined by quantum efficiency of quantum dots, a balance of charge carrier, light extraction efficiency, and the like. Particularly, in order to improve the quantum efficiency, the excitons may be confined in the emission layer, but when the excitons are not confined in the emission layer, a problem such as exciton quenching may occur.

First, referring to FIG. 1, a schematic structure of an electroluminescent device according to an embodiment is described.

FIG. 1 is a schematic cross-sectional view of an electroluminescent device according to an embodiment.

An electroluminescent device 10 according to an embodiment includes a first electrode 110 and a second electrode 160 facing each other and a hole transport layer 130, an emission layer 140, and an electron transport layer 150 disposed therebetween. The hole transport layer 130 is disposed on the first electrode 110, the emission layer 140 may be disposed directly on the hole transport layer 130 and including a plurality of light emitting particles 141, and the electron transport layer 150 is disposed on the emission layer 140.

The electroluminescent device 10 according to an embodiment supplies current to the emission layer 140 including light emitting particles 141 through the first electrode 110 and the second electrode 160, and causes electroluminescence of the light emitting particles 141 to generate light. The electroluminescent device 10 may generate light in various wavelength regions according to materials, sizes, or fine structures of the light emitting particle 141 of the emission layer 140.

In an embodiment, the first electrode 110 may be directly connected to a driving power source so may function to flow current to the emission layer 140. The first electrode 110 may include a material having light transmittance in at least the visible light wavelength region, but is not limited thereto. The first electrode 110 may include a material having light transmittance in an infrared or ultraviolet (UV) wavelength region. For example, the first electrode 110 may be an optically transparent material.

In an embodiment, the first electrode 110 may include molybdenum oxide, tungsten oxide, vanadium oxide, rhenium oxide, niobium oxide, tantalum oxide, titanium oxide, zinc oxide, nickel oxide, copper oxide, cobalt oxide, manganese oxide, chromium oxide, indium oxide, or a combination thereof.

In an embodiment, the first electrode 110 may be disposed on the substrate 100 as shown in FIG. 1. The substrate 100 may be a transparent insulating substrate or may be made of a ductile material. The substrate 100 may include glass or a polymer material in a film having a glass transition temperature (Tg) of greater than about 150° C. For example, the substrate may include a COC (cycloolefin copolymer) or COP (cycloolefin polymer) based material.

In an embodiment, the substrate 100 may support the hole transport layer 130, the emission layer 140 and the electron transport layer 150 which are sandwiched by, e.g., between, the first electrode 110 and the second electrode 160, e.g., the first electrode 100 may be on a first side of the electroluminescent device 10 and the second electrode 160 may be on a second side of the electroluminescent device 10, the first side being opposite of the second side. However, the first electrode 110 of the electroluminescent device 10 according to an embodiment is not necessarily disposed on the substrate 100, but the substrate may be disposed on the second electrode 160 or may be omitted.

The second electrode 160 includes an optically transparent material and may function as a light-transmitting electrode to transmit light generated in the emission layer 140 that will be described later. In an embodiment, the second electrode 160 may include silver (Ag), aluminum (Al), copper (Cu), gold (Au), or an alloy thereof, molybdenum oxide, tungsten oxide, vanadium oxide, rhenium oxide, niobium oxide, tantalum oxide, titanium oxide, zinc oxide, nickel oxide, copper oxide, cobalt oxide, manganese oxide, chromium oxide, indium oxide, or a combination thereof.

Each of the first electrode 110 and the second electrode 160 may be formed by depositing a material for forming an electrode on the substrate 100 or an organic layer by a method such as sputtering.

The emission layer 140 may include a plurality of light emitting particles 141. The emission layer 140 may be formed by applying a resin in which a plurality of light emitting particles 141 are dispersed on a hole transport layer 130 described later, and curing the same.

The emission layer 140 is a site where electrons and holes transported by a current supplied from the first electrode 110 and the second electrode 160, the electrons and holes are combined in the emission layer 140 to generate excitons, and the generated excitons are transitioned from an exited state to a ground state to emit light in a wavelength corresponding to the size of the light emitting particles 141.

In an embodiment, the light emitting particle 141 may include a core, e.g., a center particle, and a hydrophilic ligand attached to a surface of the core. In other embodiments, other layers, e.g., one or more shells, may be present, and the hydrophilic ligand may be attached to a surface of the outermost layer. In an embodiment, the core may include a quantum dot.

The quantum dot has a discontinuous energy bandgap by, e.g., due to, the quantum confinement effect and incident light may be converted into light having a particular wavelength and then radiated. That is, when the emission layer 140 includes a quantum dot as the light emitting particle 141, the emission layer 140 may produce light having excellent color reproducibility and color purity.

In an embodiment, a material of the quantum dot is not particularly limited and known or commercially available quantum dots may be used. For example the quantum dot may include a Group II-VI compound that does not include Cd, a Group III-V compound, a Group IV-VI compound, a Group IV element or compound, a Group I-III-VI compound, a Group I-II-IV-VI compound that does not include Cd, or a combination thereof. The quantum dot according to an embodiment may be a non-cadmium quantum dot, e.g., a quantum dot that does not include cadmium. When the quantum dot includes, e.g., consists of, a non-cadmium material, e.g., a material that does not include cadmium, the quantum dot has reduced, e.g., no, toxicity compared with a conventional cadmium quantum dot and thus is not dangerous and is environmentally-friendly.

The Group II-VI compound may be ZnS, ZnSe, ZnTe, ZnO, HgS, HgSe, HgTe, MgSe, MgS, or a mixture thereof; ZnSeS, ZnTeSe, ZnSTe, HgSeS, HgSeTe, HgSTe, HgZnS, HgZnSe, HgZnTe, MgZnSe, MgZnS, or a mixture thereof; or HgZnTeS, HgZnSeS, HgZnSeTe, HgZnSTe, or a mixture thereof. The Group II-VI compound may further include a Group III metal.

The Group III-V compound may be GaN, GaP, GaAs, GaSb, AlN, AlP, AlAs, AlSb, InN, InP, InAs, InSb, or a mixture thereof; GaNP, GaNAs, GaNSb, GaPAs, GaPSb, AlNP, AlNAs, AlNSb, AlPAs, AlPSb, InNP, InNAs, InNSb, InPAs, InPSb, InZnP, or a mixture thereof; or GaAlNP, GaAlNAs, GaAlNSb, GaAlPAs, GaAlPSb, GaInNP, GaIn-NAs, GaInNSb, GaInPAs, GaInPSb, InAlNP, InAlNAs, InAlNSb, InAlPAs, InAlPSb, or a mixture thereof. The Group III-V compound may further include a Group II metal (InZnP).

The Group IV-VI compound may be SnS, SnSe, SnTe, PbS, PbSe, PbTe, or a mixture thereof; SnSeS, SnSeTe, SnSTe, PbSeS, PbSeTe, SnPbS, SnPbSe, SnPbTe, or a mixture thereof; or SnPbSSe, SnPbSeTe, SnPbSTe, or a mixture thereof. Examples of the Group compound may be CuInSe$_2$, CuInS$_2$, CuInGaSe, and CuInGaS, are not limited thereto. Examples of the Group I-II-IV-VI compound may be CuZnSnSe and CuZnSnS, are not limited thereto. Examples of the Group IV compound may be Si, Ge, or a mixture thereof; or SiC, SiGe, or a mixture thereof.

The binary element compound, the ternary element compound or the quaternary element compound respectively exist in a uniform concentration in the particle or in partially different concentrations in the same particle.

According to an embodiment, the quantum dot may have a core-shell structure including one semiconductor nanocrystal core and another semiconductor nanocrystal shell surrounding the core. The core and the shell may have a concentration gradient wherein the concentration of the element(s) of the shell decreases toward the core. In addition, the quantum dot may have one semiconductor nanocrystal core and multiple shells surrounding the core. Herein, the multi-layered shell structure has a structure of two or more shells and each layer may have a single composition or an alloy or may have a concentration gradient.

When the quantum dot according to an embodiment has a core-shell structure, a material composition of the shell has a larger energy bandgap than that of the core, which may exhibit an effective quantum confinement effect. However, embodiments are not limited thereto. In the multi-layered shell, a shell that is far away from the core may have a higher energy bandgap than a shell that is near to the core and the quantum dot may have ultraviolet (UV) to infrared wavelength ranges.

The quantum dot may have quantum efficiency of greater than or equal to about 10%, for example, greater than or equal to about 20%, greater than or equal to about 30%, greater than or equal to about 40%, greater than or equal to about 50%, greater than or equal to about 60%, greater than or equal to about 70%, greater than or equal to about 90%, or even 100%.

In a display, the quantum dot may have a relatively narrow spectrum and may improve color purity or color reproducibility. The quantum dot may have for example a full width at half maximum (FWHM) of a photoluminescence wavelength spectrum of less than or equal to about 45 nm, less than or equal to about 40 nm, or less than or equal to or about 30 nm. Within these ranges, color purity or color reproducibility of a device may be improved.

The quantum dot may have a particle size (particle diameter for a spherical particle, and the longest size for a non-spherically shaped particle) of about 1 nm to about 100 nm. For example, the quantum dot may have a particle size of about 1 nm to about 20 nm, for example, about 2 nm (or about 3 nm) to about 15 nm.

In addition, a shape of the quantum dot is not be particularly limited. For example, the quantum dot may have a spherical, oval, tetrahedral, pyramidal, cuboctahedral, cylindrical, polyhedral, multi-armed, cubic nanoparticle, nanotube, nanowire, nanofiber, nanosheet, or a combination thereof. A plurality of quantum dots may not have a same cross-sectional shape.

The quantum dot is commercially available or may be synthesized by any suitable method. For example, several nano-sized quantum dots may be synthesized according to a wet chemical process. In the wet chemical process, precursors react in an organic solvent to grow crystal particles.

A surfactant for attaching the hydrophilic ligand is added together with the precursors, or the surfactant for attaching the hydrophilic ligand may be added to a mixed solution of the obtained quantum dots and the organic solvent.

The hydrophilic ligand according to an embodiment may be coordinated on, e.g., bound to, the surface of the quantum dot. When the quantum dot has a core-shell structure, the hydrophilic ligand may be coordinated on the surface exposed at an outside of the shell.

An organic solvent may be further coordinated on the surface of the quantum dot in addition to the hydrophilic ligand. The organic solvent coordinated on the surface of the quantum dot may affect stability of a device, and thus excess organic materials that are not coordinated on the surface of the nanocrystals may be removed by pouring the organic solvent in excess non-solvent, and centrifuging the resulting mixture. The non-solvent may be various commercially available materials. After removing the excess organic solvent, an amount of the materials coordinated on the surface of the quantum dot may be less than or equal to about 50 weight percent (wt %), for example, less than or equal to about 30 wt %, less than or equal to about 20 wt %, or less than or equal to about 10 wt % based on the weight of the quantum dot. The materials coordinated on the surface of the quantum dot may include at least hydrophilic ligand and may include a trace amount of remaining organic solvent.

The hydrophilic ligand may be an organic ligand having a hydrophilic moiety. In an embodiment, the organic ligand having the hydrophilic moiety may be a C2 to C20 linear or branched alkyl group substituted with a hydrophilic group at both terminal ends, e.g., a first terminal end of the C2 to C20 linear or branched alkyl group and a second terminal end of the C2 to C20 linear or branched alkyl group; a C2 to C20 linear or branched alkenyl group substituted with a hydrophilic group at both terminal ends, e.g., a first terminal end of the C2 to C20 linear or branched alkenyl group and a second terminal end of the C2 to C20 linear or branched alkenyl group; or a C3 to C20 alicyclic group in which at least two carbons are substituted with a hydrophilic group. In an embodiment, the hydrophilic group may be a thiol group (—SH), a hydroxy group (—OH), or a combination thereof.

In an embodiment, a composition for an emission layer includes a quantum dot to the surface of which a hydrophilic ligand is attached and an organic solvent and may use an organic solvent having hydrophilicity so as to disperse the quantum dot having hydrophilicity due to the hydrophilic ligand. The hydrophilic organic solvent according to an embodiment may include all the commercially available organic solvents having a variety of hydrophilicity. However, the hydrophilic organic solvent may be selected considering a relationship with a material of the hole transport layer 130. The hydrophilic organic solvent may be selected is to minimize damage to, e.g., of, the upper surface of the hole transport layer 130 that will be described later and which contacts the emission layer 140 due to a reaction of the hydrophilic organic solvent with the hole transport layer 130 during a solution process, e.g., a process involving or taking place in a solution, for forming an emission layer. For example, the hydrophilic organic solvent may be methanol, ethanol or isopropanol.

The hole transport layer 130 may be disposed between the first electrode 110 and the emission layer 140. The hole transport layer 130 may provide and transport holes into the emission layer 140. The hole transport layer 130 is formed directly under the emission layer 140 and directly contacts the emission layer 140.

In an embodiment, the hole transport layer 130 may include a first organic material having a conjugated structure. The first organic material may mainly include a material to minimize reactivity with the hydrophilic organic solvent for forming the emission layer 140.

In an embodiment, the first organic material may include a quinolone compound, a triazine compound, a quinoline compound, a triazole compound, a carbazole compound, an aromatic amine compound, or a combination thereof.

The hole transport layer 130 may include, e.g., consist of, at least two different first organic materials selected from the compounds. When the hole transport layer 130 includes, consists essentially of, or consists of, at least two different first organic materials, the first organic materials may be blended to provide a single layer or a layer including at least two blended organic materials, or may include or be in the form of, e.g., consist of, a separate layer of each material.

The first organic material may be a conductive monomolecular organic nanomaterial.

Specifically, the first organic material may include a compound represented by Chemical Formula 1, Chemical Formula 2, or a bicarbazole compound.

Chemical Formula 1

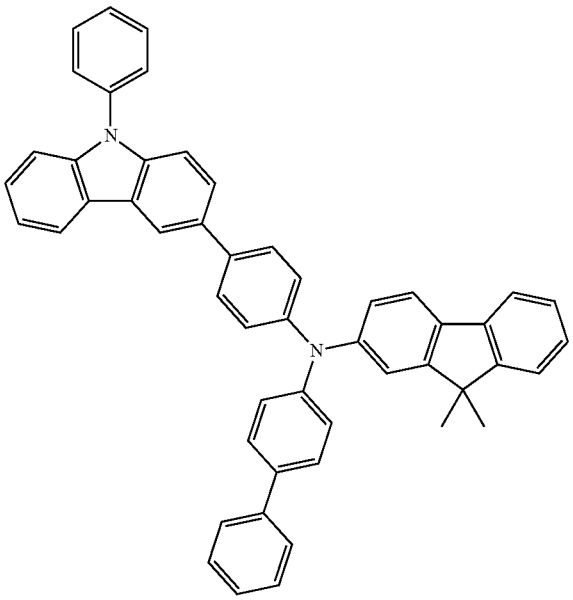

Chemical Formula 2

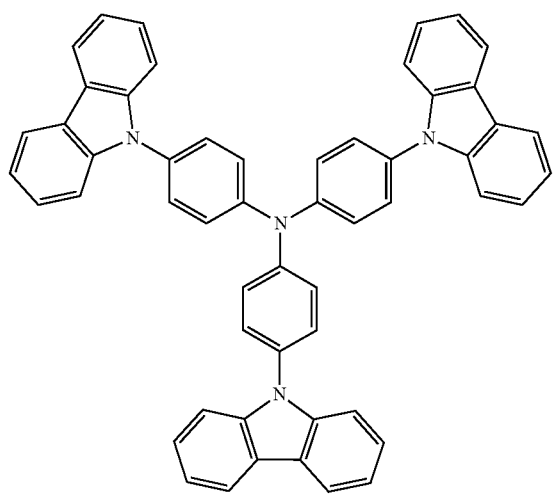

Chemical Formula 5

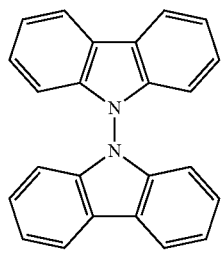

The bicarbazole compounds may be optionally be nitrogen- or ring-substituted with a C1 to C12 alkyl, a substituted or unsubstituted C6 to C12 aryl (e.g., phenyl or 3-cyanophenyl), or a C7 to C12 arylalkylene (e.g., benzyl). Examples of bicarbazole compounds include 3,3'-bicarbazole of Chemical Formula 3, 9H-3,9'-bicarbazole of Chemical Formula 4, 9,9'-bicarbazole of Chemical Formula 5, 9-phenyl-9H,9''H-3,3'-bicarbazole of Chemical Formula 6, 9-ethyl-9H-3,9'-bicarbazole of Chemical Formula 7, 3,3'-(9H,9'H-3,4'-bicarbazole-9,9'-diyl)dibenzonitrile of Chemical Formula 8, a bicarbazole compound represented by Chemical Formula 9, and the like, or a combination thereof.

Chemical Formula 6

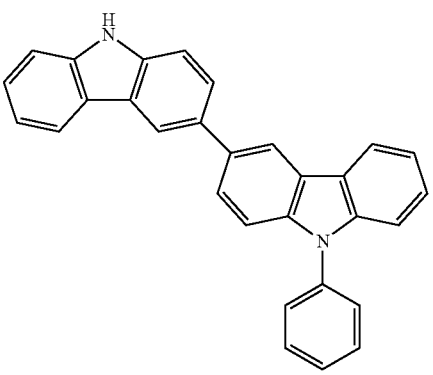

Chemical Formula 7

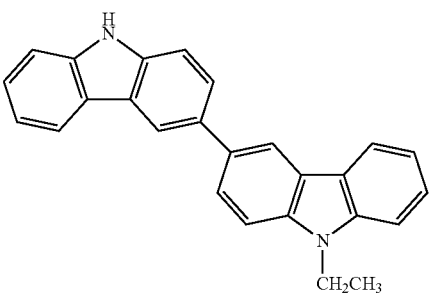

Chemical Formula 3

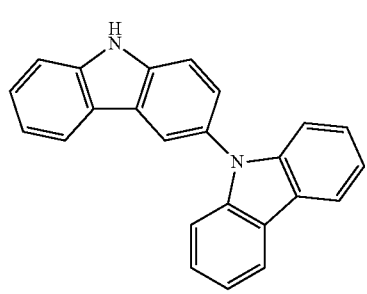

Chemical Formula 4

Chemical Formula 8

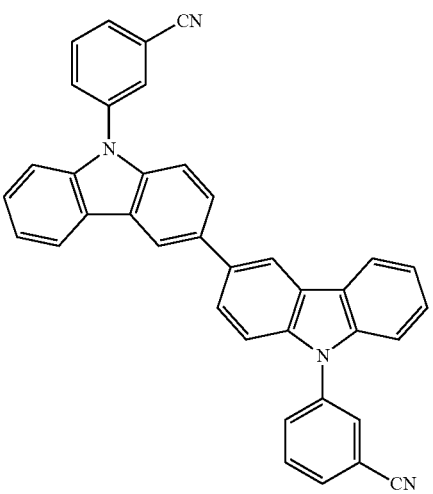

Chemical Formula 9

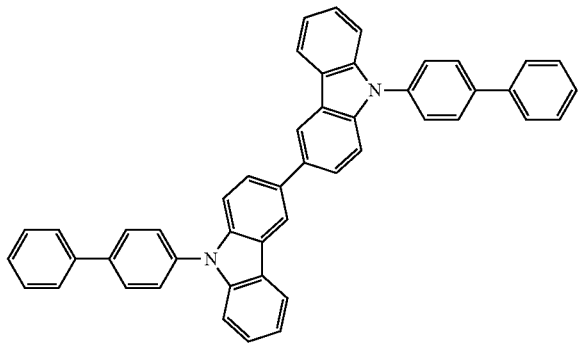

In an embodiment, a hole transport layer 130 including such a conductive monomolecular organic nanomaterial may be formed using deposition, and the like, and a blend of the at least two different first organic materials may be codeposited to form the hole transport layer 130. When the hole transport layer 130 is formed using a deposition method, a thickness of the hole transport layer 130 may be precisely controlled so that the hole transport layer 130 may have a target thickness.

A thickness of the hole transport layer 130 is not particularly limited and may be desirably controlled considering a relationship with other constituent elements of the electroluminescent device 10. The hole transport layer 130 may have an average thickness, for example greater than or equal to about 20 nm, greater than or equal to about 30 nm, greater than or equal to about 40 nm, greater than or equal to about 50 nm, greater than or equal to about 60 nm, greater than or equal to about 70 nm, greater than or equal to about 80 nm, greater than or equal to about 90 nm, greater than or equal to about 100 nm, and for example less than or equal to about 230 nm, less than or equal to about 220 nm, less than or equal to about 210 nm, less than or equal to about 200 nm, less than or equal to about 190 nm, less than or equal to about 180 nm, less than or equal to about 170 nm, or less than or equal to about 160 nm.

The hole transport layer 130 according to an embodiment may minimize the reactivity with the hydrophilic organic solvent and may concisely control the desirable thickness by deposition, and provide a thickness uniformity, e.g., a uniform thickness, within a predetermined level. For more details, supposing that the hole transport layer 130 has a first thickness and a second thickness at any two points, e.g., point locations, respectively, the first thickness and the second thickness may satisfy Equation 1.

$$\frac{t_1 - t_2}{t_1} \times 100 \leq A \qquad \text{Equation 1}$$

In Equation 1, $t_1$ is the first thickness, $t_2$ is the second thickness, $t_1 - t_2 \geq 0$, $t_1 > 0$, $t_2 > 0$, and $0 \leq A \leq 25$.

In an embodiment, the first thickness is greater than the second thickness, and equal to or less than a thickness of an initial thickness of the hole transport layer (before forming the emission layer).

In an embodiment, the second thickness is less than the first thickness, and equal to or greater than a thickness of a final thickness of the hole transport layer (after forming the emission layer).

In an embodiment, the first and second thickness may be obtained by analyzing cross-sectional SEM image of the hole transport layer. Specifically, the first thickness may be obtained by selecting an arbitrary thickness from the cross-sectional SEM image of the initial thickness of the hole transport layer, and the second thickness may be obtained by selecting an arbitrary thickness from the cross-sectional SEM image of the final thickness of the hole transport layer.

In an embodiment, the difference between the first and second thickness ($t_1-t_2$) may indicates the degree of reduction of the thickness of the hole transport layer depending on the formation of the emission layer.

In Equation 1, although A may be changed depending upon the first organic material, the hydrophilic organic solvent, whether different two or more first organic materials are blended, and the like, the A may satisfy a range, for example, $0 \leq A \leq 20$, $0 \leq A \leq 15$, $0 \leq A \leq 10$, or $0 \leq A \leq 5$.

A may indicates a rate of decreasing the thickness of the hole transport layer after the light emitting layer is formed, compared with the thickness of the initial hole transport layer.

When the hole transport layer 130 according to an embodiment satisfies Equation 1, a morphology of the upper surface of the hole transport layer 130 may be relatively uniform, e.g., the upper surface of the hole transport layer 130 may be relatively level. When the morphology of the upper surface of the hole transport layer 130 is relatively uniform, e.g., level, a driving voltage and a leakage current may be reduced, compared to the opposite case, e.g., in which the upper surface of the hole transport layer 130 is not level, and excitons may effectively be confined in the emission layer to improve the luminous efficiency of the electroluminescent device 10.

Figure 2:
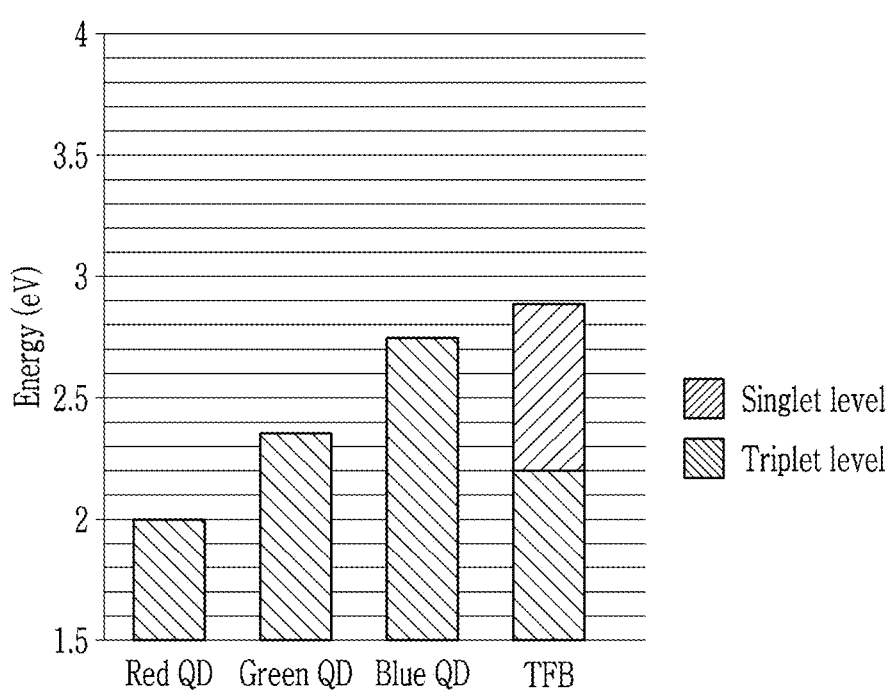
FIG. 2 is a graph comparing singlet-triplet energy of generally-used organic material (TFB) as a hole transport layer material and each quantum dot (Red QD, Green QD, and Blue QD)

FIG. 2 is a graph comparing singlet-triplet energy of generally-used organic material (TFB) as a hole transport layer material and each quantum dot (Red QD, Green QD, and Blue QD)

FIG. 2 shows poly(9,9-dioctyl-fluorene-co-N-(4-butylphenyl)-diphenylamine) (TFB) as one example of the generally-used organic material.

As shown in FIG. 2, the generally-used organic material for the hole transport layer 130 material has a minimum excitation triplet energy level (T1) of less than or equal to about 2.5 eV, for example, about 2.2 eV to about 2.3 eV. The generally-used organic material may be only used together with red quantum dots having a maximum excitation singlet energy level (S1) of about 2.0 eV. In other words, when the generally-used organic material is applied, e.g., used, with green quantum dots and blue quantum dots having maximum excitation single energy levels of about 2.4 eV, and about 2.7 eV, respectively, the exciton generated in the emission layer may not be confined in the emission layer but may be quenched. Thus when the organic material is applied to the green element and the blue element as a material for the hole transport layer 130, the luminous efficiency may be deteriorated.

On the other hand, as the first organic material according to an embodiment includes the conductive monomolecular organic nanomaterial, it has a minimum excitation triplet energy level (T1) which is greater than that of the generally-used organic material.

Figure 3:
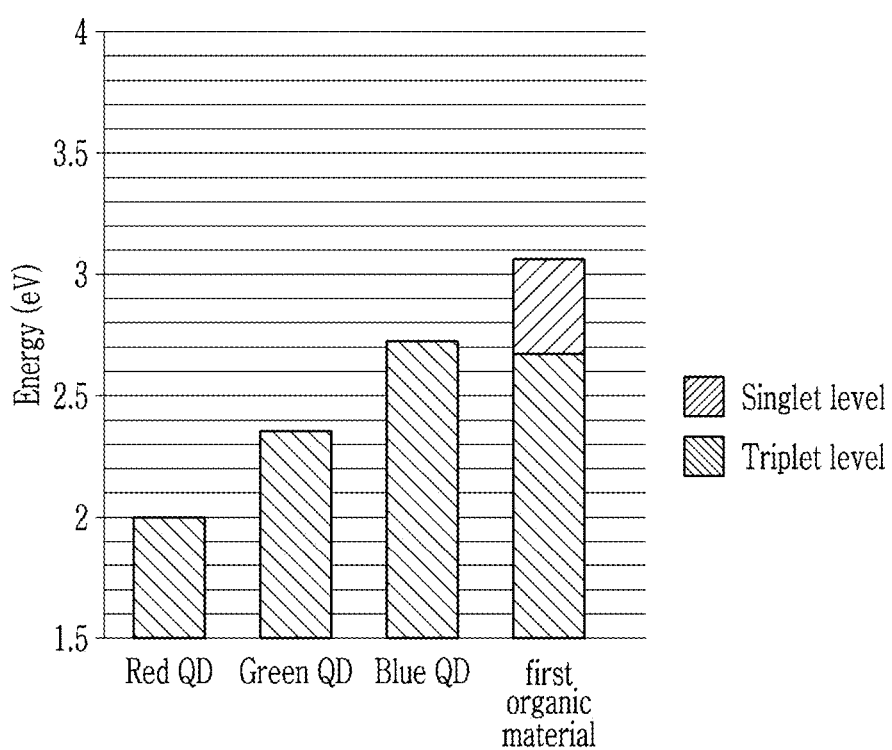
FIG. 3 is a graph comparing singlet-triplet energy of a first organic material according to an embodiment and each quantum dot.

FIG. 3 is a graph comparing singlet-triplet energy of a first organic material according to an embodiment and each quantum dot.

As shown in FIG. 3, the first organic material has a minimum excitation triplet energy level higher than the maximum excitation singlet energy levels of red quantum dots, green quantum dots. In addition, the first organic material shows, exhibits, a minimum excitation triplet energy level which is almost similar, e.g., approximately equal, to the maximum excitation singlet energy level of blue quantum dots, or the first organic material may have a minimum excitation triplet energy level which is even greater than the maximum excitation singlet energy level of blue quantum dots.

The first organic material according to an embodiment may have a minimum excitation triplet energy level (T1) of, for example, greater than or equal to about 2.6 eV, greater than or equal to about 2.7 eV, greater than or equal to about 2.8 eV and, for example, less than or equal to about 3.2 eV, less than or equal to about 3.1 eV, and, less than or equal to about 3.0 eV.

When the first organic material having a minimum excitation triplet energy level which is similar to the maximum excitation singlet energy level of blue quantum dots used for the emission layer 140 is used as a material for the hole transport layer 130, excitons may be effectively confined in the emission layer 140.

The electroluminescent device 10 according to an embodiment may further a hole injection layer 120 between the first electrode 110 and the hole transport layer 130. The hole injection layer 120 may supply hole into the emission layer 140 together with the hole transport layer 130 or may be omitted considering the thickness and the material of the hole transport layer 130, and the like.

The hole injection layer 120 may include a second organic material having a conjugated structure. The second organic material may include a conductive monomolecular organic nanomaterial, a conductive low molecular organic nanomaterial having a conjugated structure, or a combination thereof.

The hole injection layer 120 may be formed using the deposition method as in the hole transport layer 130, but is not limited thereto.

The conductive monomolecular organic nanomaterial may include a quinolone compound, a triazine compound, a quinoline compound, a triazole compound, a carbazole compound, an aromatic amine compound, or a combination thereof.

When the second organic material is the conductive monomolecular organic nanomaterial, the second organic material may be the same as or different from the first organic material.

The hole injection layer 120 according to an embodiment may include, e.g., consist of, a second organic material and the second organic material may be doped with a p-type dopant. The p-type dopant may be known p-type dopants without limitation. The hole injection layer 120 may reinforce a function of a hole supply source in electroluminescent device 10.

In an embodiment, the electron transport layer 150 is disposed between the emission layer 140 and the second electrode 160 and transports charges into the emission layer 140. The electron transport layer may include an inorganic oxide nanoparticle or may be an organic layer formed by deposition.

An electron injection layer for facilitating transport of electrons and/or a hole blocking layer for blocking transport of holes may be further formed between the electron transport layer 150 and the second electrode 160.

The thickness of each of the electron transport layer 150, the electron injection layer, and the hole blocking layer may be desirably selected. For example, the thickness of each of the layers may be greater than or equal to about 1 nm and less than or equal to about 500 nm, but is not limited thereto. The electron injection layer may be an organic layer formed by a deposition.

The electron injection layer and/or electron transport layer 150 may include for example 1,4,5,8-naphthalene-tetracarboxylic dianhydride (NTCDA), bathocuproine (BCP), tris [3-(3-pyridyl)-mesityl]borane (3TPYMB), LiF, Alq$_3$, Gaq$_3$, Inq$_3$, Znq$_2$, Zn(BTZ)$_2$, BeBq$_2$, ET204 (8-(4-(4,6-di(naphthalen-2-yl)-1,3,5-triazin-2-yl)phenyl)quinolone), 8-hydroxyquinolinato lithium (Liq), n-type metal oxide (e.g., ZnO, HfO$_2$, etc.), Bphen, ABH113, NET218, NET338, NDN77, NDN87, or a combination thereof, but is not limited thereto.

The hole blocking layer may include for example 1,4,5, 8-naphthalene-tetracarboxylic dianhydride (NTCDA), bathocuproine (BCP), tris[3-(3-pyridyl)-mesityl] borane (3TPYMB), LiF, Alq$_3$, Gaq$_3$, Inq$_3$, Znq$_2$, Zn(BTZ)$_2$, BeBq$_2$, or a combination thereof, but is not limited thereto.

In the electroluminescent device 10 according to an embodiment, the other constituent elements except the emission layer 140 may be formed by a method such as deposition. Thereby, the other constituent elements except the emission layer 140 may be formed in a common layer during formation of a display device.

In the electroluminescent device 10 according to an embodiment, the upper surface of the electron transport layer 150 may be directly contacted during the solution process of the composition for the emission layer 140, but it may minimize the reactivity with the hydrophilic organic solvent, so the morphology of the upper surface of the electron transport layer 150 may be maintained in a substantially uniform level even if the solution process is completed. Thus the driving voltage and the leakage current may be decreased by the morphology of the upper surface of the electron transport layer 150.

In addition, the material for the electron transport layer 150 has a high minimum excitation triplet energy level which is similar to a maximum excitation singlet energy level of blue quantum dots having the highest energy level. Therefore, exciton may be effectively confined in the emission layer 140.

Hereinafter, a display device including the electroluminescent device 10 is described.

A display device according to an embodiment includes a substrate, a driving circuit formed on the substrate, and a first electroluminescent device, a second electroluminescent device, and a third electroluminescent device spaced apart from each other in a predetermined interval and disposed on the driving circuit.

The first to third electroluminescent devices have the same structure as the electroluminescent device 10 and but the wavelength of the light emitted from each of the quantum dots may be different from each other.

In an embodiment, the first electroluminescent device is a red device emitting red light, the second electroluminescent device is a green device emitting green light, and the third electroluminescent device is a blue device emitting blue light. In other words, the first to third electroluminescent devices may be pixels expressing, e.g., displaying, red, green, and blue, respectively, in the display device.

However, an embodiment is not necessarily limited thereto, but the first to third electroluminescent devices may respectively express magenta, yellow, and cyan, or may express other colors.

At least one of the first to third electroluminescent devices may be the electroluminescent device 10. In this case, at least the third electroluminescent device displaying blue may be desirably the electroluminescent device 10.

In the display device according to an embodiment, a hole injection layer, a hole transport layer, an electron transport layer, an electron injection layer, and a hole blocking layer except an emission layer of each pixel may be integrated to form a common layer. However, an embodiment is not limited thereto. A hole injection layer, a hole transport layer, an electron transport layer, an electron injection layer, and a hole blocking layer may be independently formed in each pixel of the display device, or at least one of a hole injection layer, a hole transport layer, an electron transport layer, an electron injection layer, and a hole blocking layer may form a common layer and remaining layers may form a separate independent layer.

The substrate may be a transparent insulating substrate or may be made of a ductile material. The substrate may include glass or a polymer material in a film having a glass transition temperature (Tg) of greater than about 150° C. For example, the substrate may include a COC (cycloolefin copolymer) or COP (cycloolefin polymer) based material. All the first to third electroluminescent devices are formed on the substrate. That is, a substrate of the display device according to an embodiment provides a common layer.

The driving circuit is disposed on the substrate and is independently connected to each of the first to third electroluminescent devices. The driving circuit may include at least one of a scan line, a data line, a driving power source line, a common power source line, or the like, at least two of thin film transistors (TFT) connected to the wire and corresponding to one organic light emitting diode, and at least one capacitor, or the like. The driving circuit may have a variety of the known structures.

As described above, the display device according to an embodiment may display excellent images having excellent color purity and color reproducibility without disposing, e.g., using, an additional light source such as a backlight unit. In addition, the display device according to an embodiment may decrease, particularly, the leakage current and the driving voltage in the device and minimize the exciton quenching of each device, so the display device may exhibit improved, e.g., excellent, light emitting characteristics even in, e.g., with, a low electric power.

Hereinafter, embodiments are illustrated in more detail with reference to examples. However, these examples are exemplary, and the present disclosure is not limited thereto.

Example 1

An indium tin oxide (ITO) layer is deposited on a glass substrate, and an organic material represented by Chemical Formula 1 is deposited thereon to provide a hole injection layer, and the bicarbazole compound (Samsung SDI Co, a bicarbazole compound represented by the Chemical Formula 9) is deposited thereon to provide a hole transport layer. The obtained hole transport layer has a thickness of about 52 nm.

Separately, red quantum dots (InP) and a hydrophilic surfactant are mixed, and mercapto hexanol is attached to the surface of the red quantum dot as a hydrophilic ligand. In this case, thiol group (—SH) contained in the mercaptohexanol is chemically bonded to the surface of the red quantum dots. Then the red quantum dots attached with the hydrophilic ligand are dispersed in isopropyl alcohol (IPA) to prepare a composition for an emission layer.

The prepared composition for the emission layer is coated on the hole transport layer and dried under a nitrogen atmosphere to provide an emission layer directly on the hole transport layer. During the process of forming the emission layer, the thickness of the hole transport layer changed by the isopropyl alcohol is about 47.5 nm.

Subsequently, the friaryl triazine compound (Samsung SDI Co, ET204) and lithium quinolate (Liq) are co-deposited at a weight ratio of 1:1 on the emission layer under the vacuum condition to provide an electron transport layer, and Liq is deposited thereon to provide an electron injection layer. Then Al is deposited on the electron injection layer to provide an electroluminescent device (ITO/Chemical Formula 1/Chemical Formula 9/Red QD/triaryl triazine compound:Liq (1:1)/Liq/Al) including a red quantum dot emission layer according to Example 1.

Example 2

An electroluminescent device (ITO/Chemical Formula 1/Chemical Formula 9/Red QD/triaryl triazine compound: Liq (1:1)/Liq/Al) including a red quantum dot emission layer according to Example 2 is obtained in accordance with the same procedure as in Example 1, except that methanol is used as the hydrophilic organic solvent, instead of isopropyl alcohol, and the thickness of the hole transport layer changed by the methanol during preparing the emission layer is about 48 nm.

Example 3

An electroluminescent device (ITO/Chemical Formula 1/Chemical Formula 9/Red QD/triaryl triazine compound: Liq (1:1)/Liq/Al) including a red quantum dot emission layer according to Example 3 is obtained in accordance with the same procedure as in Example 1, except that ethanol is used as the hydrophilic organic solvent instead of isopropyl alcohol, and the thickness of the hole transport layer changed by the ethanol during preparing the emission layer is about 45 nm.

Example 4

An electroluminescent device (ITO/Chemical Formula 1/Chemical Formula 2/Red QD/triaryl triazine compound: Liq (1:1)/Liq/Al) including a red quantum dot emission layer according to Example 4 is obtained in accordance with the same procedure as in Example 1, except that the compound represented by Chemical Formula 2 is used as the hole transport layer material instead of the bicarbazole compound represented by the Chemical Formula 9, and the thickness of the hole transport layer changed by isopropyl alcohol during preparing the emission layer is about 23.6 nm.

Example 5

An electroluminescent device (ITO/Chemical Formula 1/Chemical Formula 2/Red QD/triaryl triazine compound: Liq (1:1)/Liq/Al) including a red quantum dot emission layer according to Example 5 is obtained in accordance with the same procedure as in Example 4, except that methanol is used as the hydrophilic organic solvent instead of isopropyl alcohol, and the thickness of the hole transport layer changed by the methanol during preparing the emission layer is about 24.4 nm.

Example 6

An electroluminescent device (ITO/Chemical Formula 1/Chemical Formula 2/Red QD/triaryl triazine compound:

Liq (1:1)/Liq/Al) including a red quantum dot emission layer according to Example 6 is obtained in accordance with the same procedure as in Example 4, except that ethanol is used as the hydrophilic organic solvent instead of isopropyl alcohol, and the thickness of the hole transport layer changed by the ethanol during preparing the emission layer is about 21.5 nm.

Example 7

An electroluminescent device (ITO/Chemical Formula 1/Chemical Formula 9/Blue QD/triaryl triazine compound:Liq (1:1)/Liq/Al) including a blue quantum dot emission layer according to Example 7 is obtained in accordance with the same procedure as in Example 1, except that blue QD (ZnTeSe) is used to provide an emission layer instead of red QD.

Comparative Example 1

An ITO layer is deposited on a glass substrate, and a hole auxiliary layer composition in which TFB and an organic solvent are mixed is coated thereon. The composition for the emission layer obtained from Example 1 is coated on the coated hole auxiliary layer composition. Subsequently, the coated hole auxiliary layer composition and the composition for the emission layer are dried together under the nitrogen atmosphere to provide a hole auxiliary layer including TFB and an emission layer including red quantum dots. Then a friaryl triazine compound and Liq are co-deposited at a weight ratio of 1:1 on the emission layer under the vacuum condition to provide an electron transport layer, and Liq is deposited thereon to provide an electron injection layer. Then Al layer is deposited on the electron injection layer to provide an electroluminescent device (ITO/TFB/Red QD/triaryl triazine compound:Liq (1:1)/Liq/Al) including a red quantum dot emission layer according to Comparative Example 1.

Comparative Example 2

An electroluminescent device (ITO/Chemical Formula 1/Chemical Formula 9/Red QD/triaryl triazine compound:Liq (1:1)/Liq/Al) including a red quantum dot emission layer according to Comparative Example 2 is obtained in accordance with the same procedure as in Example 1, except that butanol is used as the hydrophilic organic solvent instead of isopropyl alcohol, and the thickness of the hole transport layer changed by the butanol during preparing the emission layer is about 31 nm.

Comparative Example 3

An electroluminescent device (ITO/Chemical Formula 1/Chemical Formula 2/Red QD/triaryl triazine compound:Liq (1:1)/Liq/Al) including a red quantum dot emission layer according to Comparative Example 3 is obtained in accordance with the same procedure as in Example 4, except that butanol is used as the hydrophilic organic solvent instead of isopropyl alcohol, and the thickness of the hole transport layer changed by the butanol during preparing the emission layer is about 14.5 nm.

Comparative Example 4

An electroluminescent device (ITO/Chemical Formula 1/Chemical Formula 9/Red QD/triaryl triazine compound:Liq (1:1)/Liq/Al) including a red quantum dot emission layer according to Comparative Example 4 is obtained in accordance with the same procedure as in Example 1, except that the hydrophobic organic solvent cyclohexane is used instead of the hydrophilic organic solvent isopropyl alcohol, and the thickness of the hole transport layer changed by the cyclohexane during preparing the emission layer is less than 5 nm.

Comparative Example 5

An electroluminescent device (ITO/Chemical Formula 1/Chemical Formula 2/Red QD/triaryl triazine compound:Liq (1:1)/Liq/Al) including a red quantum dot emission layer according to Comparative Example 5 is obtained in accordance with the same procedure as in Example 4, except that the hydrophobic organic solvent cyclohexane is used instead of the hydrophilic organic solvent isopropyl alcohol, and the thickness of the hole transport layer changed by the cyclohexane during preparing the emission layer is less than 5 nm.

Comparative Example 6

An electroluminescent device (ITO/TFB/Blue QD/triaryl triazine compound:Liq (1:1)/Liq/Al) including a blue quantum dot emission layer according to Comparative Example 6 is obtained in accordance with the same procedure as in Comparative Example 1, except that blue QD (ZnTeSe) is used to provide an emission layer instead of red QD.

Evaluation 1: Changes of Device Characteristics Depending Upon First Organic Layer Materials Each electroluminescent device obtained from Example 1 and Comparative Example 1 is measured for a voltage-current density relationship, a luminance-external quantum efficiency relationship, and a wavelength-normalized intensity relationship, and the results are shown in FIGS. 4 to 6, respectively.

Figure 4:
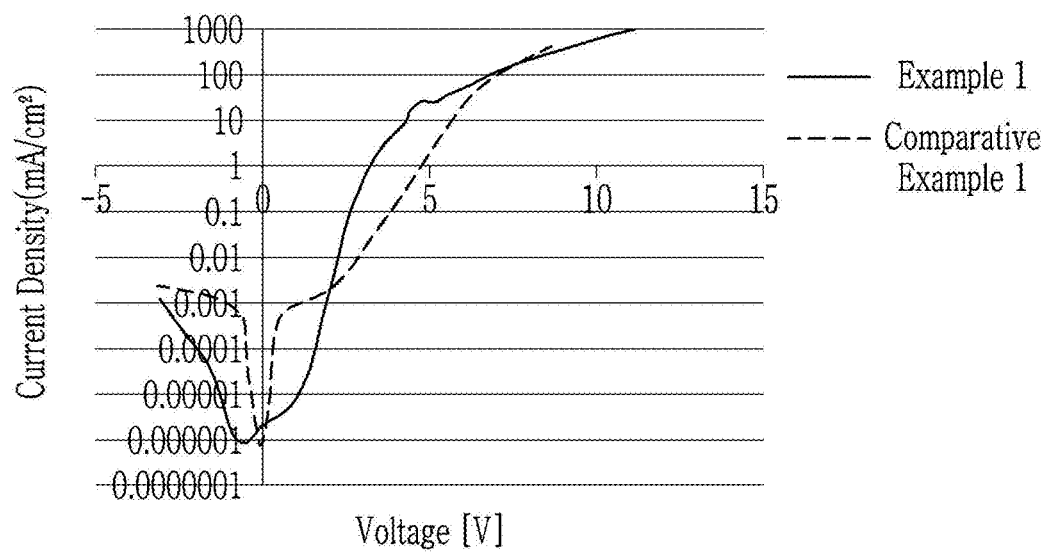
FIG. 4 is a graph showing voltage-current density of the electroluminescent devices according to Example 1 and Comparative Example 1.

FIG. 4 is a graph showing voltage-current density of the electroluminescent devices according to Example 1 and Comparative Example 1.

Referring to FIG. 4, it is confirmed that the voltage at 5 milliamperes (mA) is 3.938 volts (V) in Example 1, but the voltage at the same condition is 5.417 V in Comparative Example 1. While not wanting to be bound by theory, it is understood that the charge transport layer of Example 1, which is formed of a monomolecular material, has better hole mobility than the charge transport layer of Comparative Example 1, which is formed of a polymer material.

Figure 5:
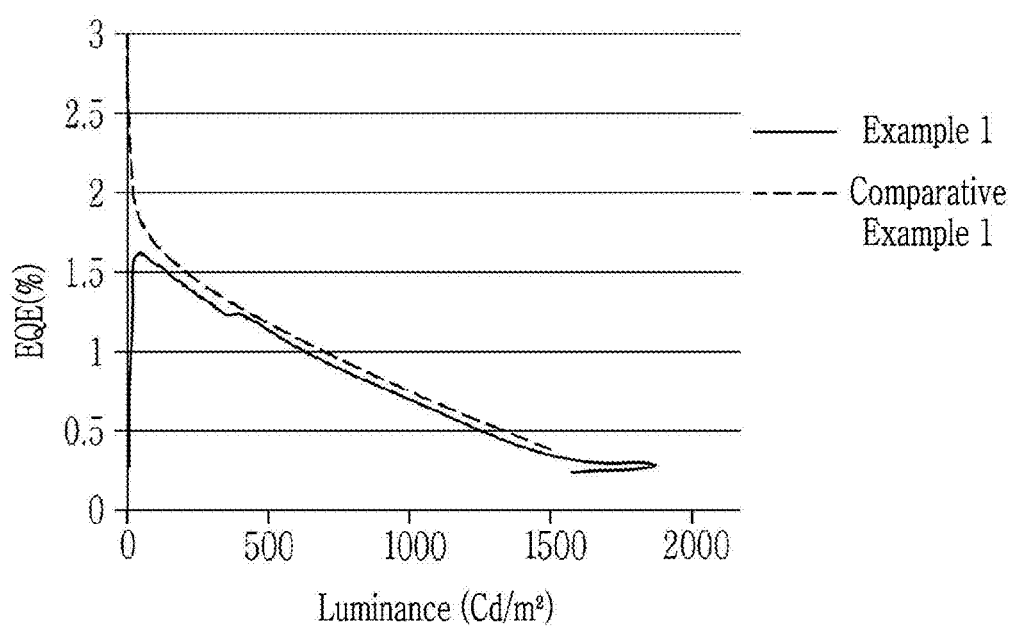
FIG. 5 is a graph showing luminance-external quantum efficiency of the electroluminescent devices according to Example 1 and Comparative Example 1.
Figure 6:
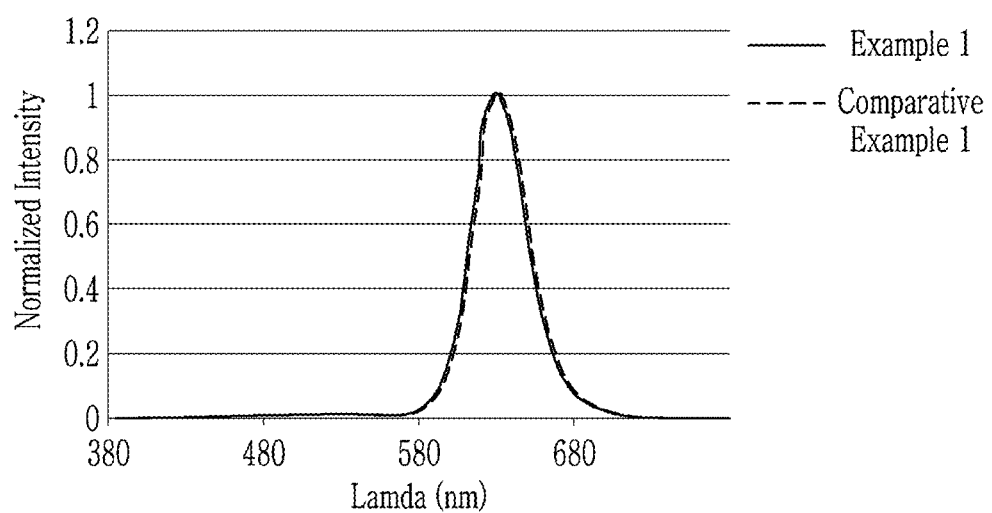
FIG. 6 is a graph showing wavelength-normalized intensity of the electroluminescent devices according to Example 1 and Comparative Example 1.

FIG. 5 is a graph showing luminance-external quantum efficiency (EQE) of the electroluminescent devices according to Example 1 and Comparative Example 1.

Referring to FIG. 5, it is understood that the electroluminescent device according to Example 1 shows an external quantum efficiency equivalent to that according to Comparative Example 1 within a luminance range of less than or equal to 1,500 nit (candela per square meter), particularly, the electroluminescent device according to Example 1 shows the excellent external quantum efficiency of 1.54% at 100 nit.

FIG. 6 is a graph showing wavelength-normalized intensity of the electroluminescent devices according to Example 1 and Comparative Example 1.

Referring to FIG. 6, it is understood that both Example 1 and Comparative Example 1 show a center wavelength of 629 nm to 631 nm and a full width at half maximum (FWHM) of about 40 nm which are similar values to each other. The (CIE_X, CIE_Y) value of emitted light according to Example 1 is (0.6747, 0.3234); and the value of emitted light according to Comparative Example 1 is (0.6756, 0.3200). It is confirmed that the emitted lights according to Example 1 and Comparative Example 1 are red lights having equivalent chromaticity, intensity, and color purity.

Evaluation 2: Change of Thickness of Hole Transport Layer Depending Upon Hole Transport Layer Material and Organic Solvent Characteristics of each electroluminescent device according to Examples 1 to 6 and Comparative Examples 2 to 5 and an initial thickness of the hole transport layer at the first time, a thickness of the hole transport layer after forming the emission layer, and a rate of decreasing the thickness after forming the emission layer with respect to the initial thickness are measured, and the results are shown in Table 1.

TABLE 1

| | Hole transport layer material | Organic solvent | Initial thickness | Thickness after forming emission layer | Thickness decrease amount |
|---|---|---|---|---|---|
| Example 1 | Chemical Formula 9 | Isopropyl alcohol | 52 nm | 47.5 nm | 9% |
| Example 2 | Chemical Formula 9 | methanol | 52 nm | 48 nm | 8% |
| Example 3 | Chemical Formula 9 | ethanol | 52 nm | 45 nm | 13% |
| Example 4 | Chemical Formula 2 | Isopropyl alcohol | 27.8 nm | 23.6 nm | 15% |
| Example 5 | Chemical Formula 2 | methanol | 27.8 nm | 24.4 nm | 12% |
| Example 6 | Chemical Formula 2 | ethanol | 27.8 nm | 21.5 nm | 23% |
| Comparative Example 2 | Chemical Formula 9 | butanol | 52 nm | 31 nm | 40% |
| Comparative Example 3 | Chemical Formula 2 | butanol | 27.8 nm | 14.5 nm | 48% |
| Comparative Example 4 | Chemical Formula 9 | cyclohexane | 52 nm | less than 5 nm | 90% or greater |
| Comparative Example 5 | Chemical Formula 2 | cyclohexane | 27.8 nm | less than 5 nm | 90% or greater |

Referring to Table 1, it is confirmed that Examples 1 to 6 show very low thickness decrease rate compared to the Comparative Examples.

It is confirmed that from the results of Examples 1 to 3, or Examples 4 to 6, the thickness decrease rate is changed depending upon the type of hydrophilic organic solvent even if using the same material of the hole transport layer material.

In addition, comparing Examples 1 to 5 with Comparative Examples 4 and 5, it is confirmed that the hole transport layer formed of the monomolecular material is almost dissolved (as indicated, e.g., by a thickness decrease rate of 90% or greater) when using the hydrophobic organic solvent instead of the hydrophilic organic solvent.

Evaluation 3: Changes of Device Characteristics Depending Upon QD Type

Figure 7:
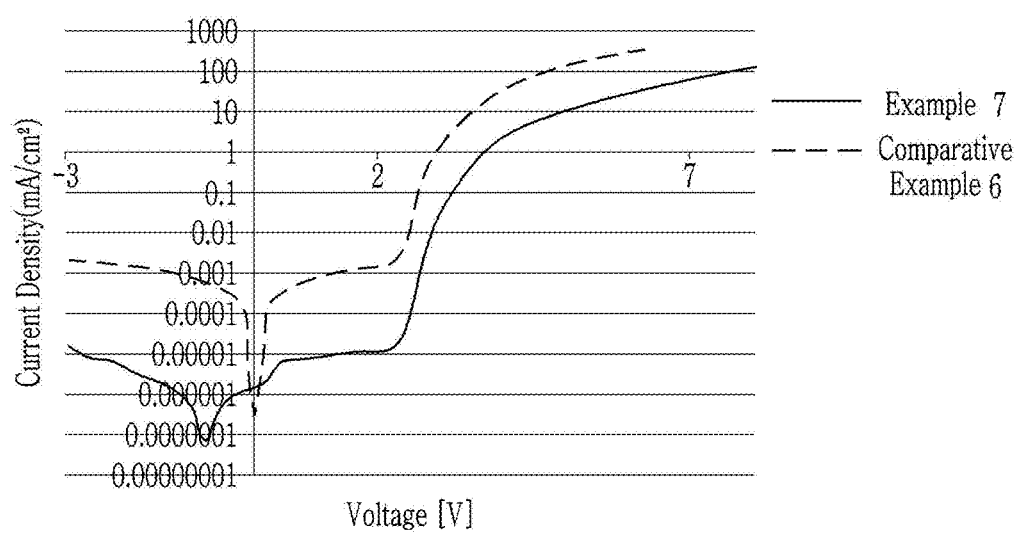
FIG. 7 is a graph showing voltage-current density of the electroluminescent devices according to Example 7 and Comparative Example 6.
Figure 8:
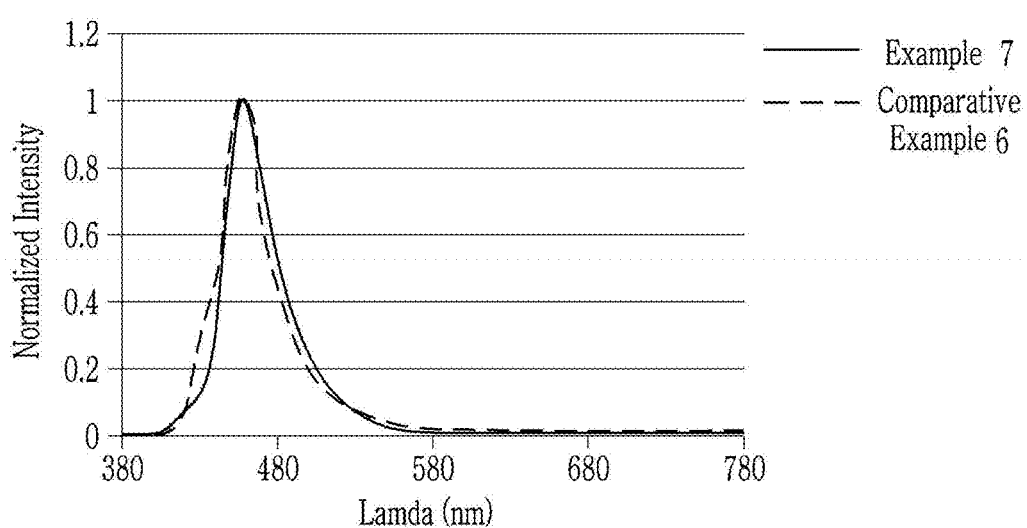
FIG. 8 is a graph showing wavelength-normalized intensity of the electroluminescent devices according to Example 7 and Comparative Example 6.

Each electroluminescent device obtained from Example 7 and Comparative Example 6 is measured for a voltage-current density relationship, and a wavelength-normalized intensity relationship, and the results are shown in FIGS. 7 to 8, respectively.

FIG. 7 is a graph showing voltage-current density of the electroluminescent devices according to Example 7 and Comparative Example 6, Referring to FIG. 7, the current density of the electroluminescent device according to Example 7 is lower than that of Comparative Example 6, on the basis of the same driving voltage. That is, the electroluminescent device according to Example 7 exhibits a lower leakage current than that of Comparative Example 6. It is understood that the case of Example 7 in which the charge transport layer is formed of a single molecule material has a uniform upper surface morphology compared to Comparative Example 6 in which the charge transport layer is formed of a polymer material.

FIG. 8 is a graph showing wavelength-normalized intensity of the electroluminescent devices according to Example 7 and Comparative Example 6.

Referring to FIG. 8, it can be seen that both of Example 7 and Comparative Example 6 exhibits a center wavelength of 455 nm to 460 nm and a half width of about 35 nm. Meanwhile, the (CIE_X, CIE_Y) value of emitted light according to Example 7 is (0.1380, 0.0944) and the value of emitted light according to Comparative Example 6 is (0.1289, 0.0804).

Meanwhile, referring to FIG. 8, it can be seen that the emitted light of Example 7 shows improved color purity over Comparative Example 6 in a wavelength range of about 400 nm to about 455 nm.

Referring to FIG. 8, it is understood that the electroluminescent device according to Example 7 and Comparative Example 6 may emit blue light having the same chromaticity and intensity. However, Example 7 can emit blue light having a higher color purity than Comparative Example 6.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:
1. An electroluminescent device, comprising
a first electrode;
a hole transport layer disposed on the first electrode and comprising a first organic material having a conjugated structure;

an emission layer disposed directly on the hole transport layer and comprising a plurality of light emitting particles;

an electron transport layer disposed on the emission layer; and a second electrode disposed on the electron transport layer, wherein at least one of the light emitting particles comprises a core and a hydrophilic ligand attached to a surface of the core, wherein the hole transport layer has a first thickness and a second thickness at any two point locations, and the first thickness and the second thickness satisfy Equation 1

$$\frac{t_1 - t_2}{t_1} \times 100 \le A$$ Equation 1 wherein, in Equation 1, $t_1$ is the first thickness, $t_2$ is the second thickness, $t_1 - t_2 \ge t_1 > 0$, $t_2 > 0$, and $0 \le A \le 25$.

2. The electroluminescent device of claim 1, wherein the first organic material has a minimum excitation triplet energy level of about 2.6 electronvolts to about 3.0 electronvolts.

3. The electroluminescent device of claim 1, wherein the first organic material comprises a conductive monomolecular organic nanomaterial.

4. The electroluminescent device of claim 1, wherein the first organic material comprises a quinolone compound, a triazine compound, a quinoline compound, a triazole compound, a carbazole compound, an aromatic amine compound, or a combination thereof.

5. The electroluminescent device of claim 1, wherein the first organic material comprises a compound represented by Chemical Formula 1, Chemical Formula 2, or a bicarbazole compound:

Chemical Formula 1

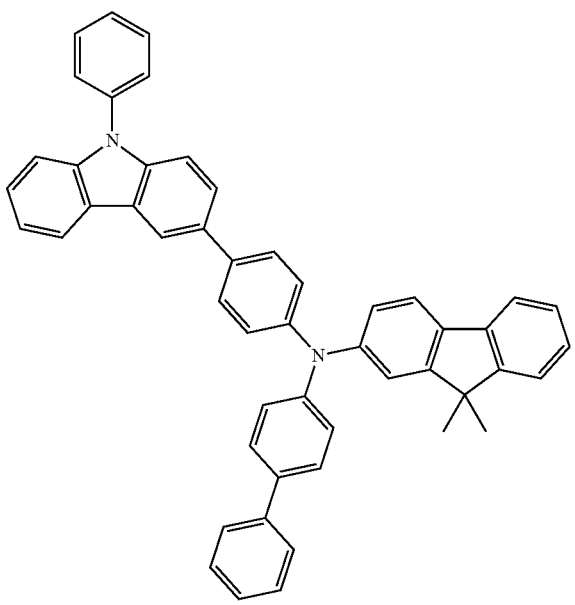

Chemical Formula 2

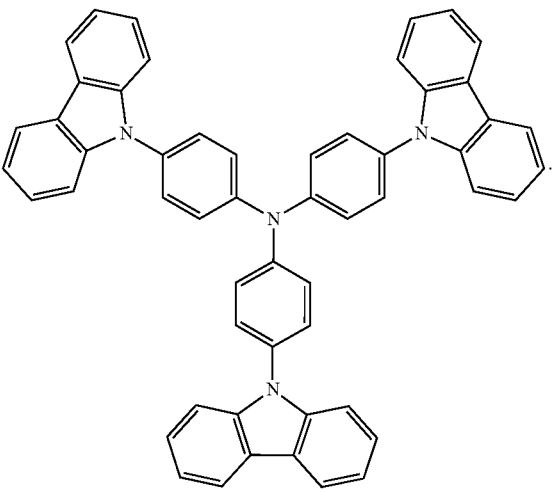

6. The electroluminescent device of claim 1, wherein the hole transport layer comprises at least two different first organic materials.

7. The electroluminescent device of claim 6, wherein the at least two different first organic materials are mixed to provide a single layer.

8. The electroluminescent device of claim 6, wherein the hole transport layer comprises at least two different first organic materials, and
each of the at least two different first organic materials comprises a separate layer.

9. The electroluminescent device of claim 1, wherein the hole transport layer has an average thickness in a range of about 20 nanometers to about 200 nanometers.

10. The electroluminescent device of claim 1, wherein the hydrophilic ligand comprises a C2 to C20 linear or branched alkyl group substituted with a thiol group at a first terminal end of the C2 to C20 linear or branched alkyl group and a hydroxy group at a second terminal end of the C2 to C20 linear or branched alkyl group.

11. The electroluminescent device of claim 1, wherein the core comprises a quantum dot.

12. The electroluminescent device of claim 11, wherein the quantum dot comprises a Group II-VI compound that does not comprise Cd, a Group III-V compound, a Group IV-VI compound, a Group IV element or compound, a Group compound, a Group I-II-IV-VI compound that does not comprise Cd, or a combination thereof.

13. The electroluminescent device of claim 11, wherein the quantum dot has a core-shell structure and the hydrophilic ligand is attached to a surface of the shell.

14. The electroluminescent device of claim 1, further comprising a hole injection layer between the first electrode and the hole transport layer.

15. The electroluminescent device of claim 14, wherein the hole injection layer comprises a second organic material having a conjugated structure.

16. The electroluminescent device of claim 15, wherein the second organic material comprises a conductive monomolecular organic nanomaterial having a conjugation structure, a conductive low molecular organic nanomaterial having a conjugated structure, or a combination thereof.

17. The electroluminescent device of claim 15, wherein the second organic material comprises a quinolone compound, a triazine compound, a quinoline compound, a triazole compound, a carbazole compound, an aromatic amine compound, or a combination thereof.

18. The electroluminescent device of claim 15, wherein the hole injection layer comprises the second organic material, and the second organic material is doped with a p-type dopant.

19. A display device comprising the electroluminescent device of claim 1.

* * * * *